(12) United States Patent
Dunn et al.

(10) Patent No.: US 6,768,369 B1
(45) Date of Patent: Jul. 27, 2004

(54) THRESHOLD VOLTAGE COMPENSATION

(75) Inventors: Daniel J. Dunn, Loomis, CA (US); Mohammad S. Haider, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/448,304

(22) Filed: May 30, 2003

(51) Int. Cl.$^7$ .................................................. H03K 3/01
(52) U.S. Cl. ........................................................ 327/534
(58) Field of Search .................................. 327/318, 319, 327/333, 530, 534, 535, 537, 538, 540, 541, 543, 544

(56) References Cited

U.S. PATENT DOCUMENTS 5,748,025 A  *  5/1998  Ng et al. ..................... 327/333
6,130,568 A     10/2000 Kwon et al. ................ 327/307
6,465,157 B1 * 10/2002 Li et al. ...................... 430/313
6,535,059 B2 *  3/2003  Lipperer et al. ............. 330/85
6,556,068 B2    4/2003  Forbes et al. ............... 327/537
6,670,939 B2 * 12/2003  Yang et al. .................. 345/98

* cited by examiner

Primary Examiner—Jeffrey Zweizig
(74) Attorney, Agent, or Firm—Fleshner & Kim, LLP

(57) ABSTRACT

A threshold voltage compensation method and circuit compensates a bias voltage applied to a transistor gate to account for variations in the transistors threshold voltage. In one embodiment, a logic stack includes three transistors in series between a high voltage source and ground with a higt voltage output between the first and second transistor and a full swing output between the second transistor and the third transistor. A bias voltage is applied to the gate of the second transistor to provide a minimum voltage level for the high voltage output. As the threshold voltage of the second transistor varies, the bias voltage is adjusted to compensate for the threshold voltage level variance and maintain the minimum voltage level for the higt voltage output.

26 Claims, 9 Drawing Sheets

THRESHOLD VOLTAGE COMPENSATION

BACKGROUND OF THE INVENTION

1. Field of the Invention

The present invention relates to threshold voltage compensation. In particular, the present invention relates to threshold voltage compensation for transistors.

2. Background of the Related Art

Transistors are in widespread use in many applications including logic devices. The performance of these transistors can be affected by threshold voltage variations. Variations in threshold voltages occur because of numerous causes. For example, a typical PMOS transistor will operate (turn-on and off) as the voltage between the gate and source drops below or rises above the threshold voltage of the transistor. However, the threshold voltage of a transistor can change over time because of the degradation of the transistor material. Thus, the operation of the transistor will vary as the threshold voltage characteristic of the transistor varies. Therefore, the operational parameters or characteristics of a logic device that includes transistors may change as the threshold voltage characteristic of the individual components change.

These and other disadvantages exist in conventional circuitry.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
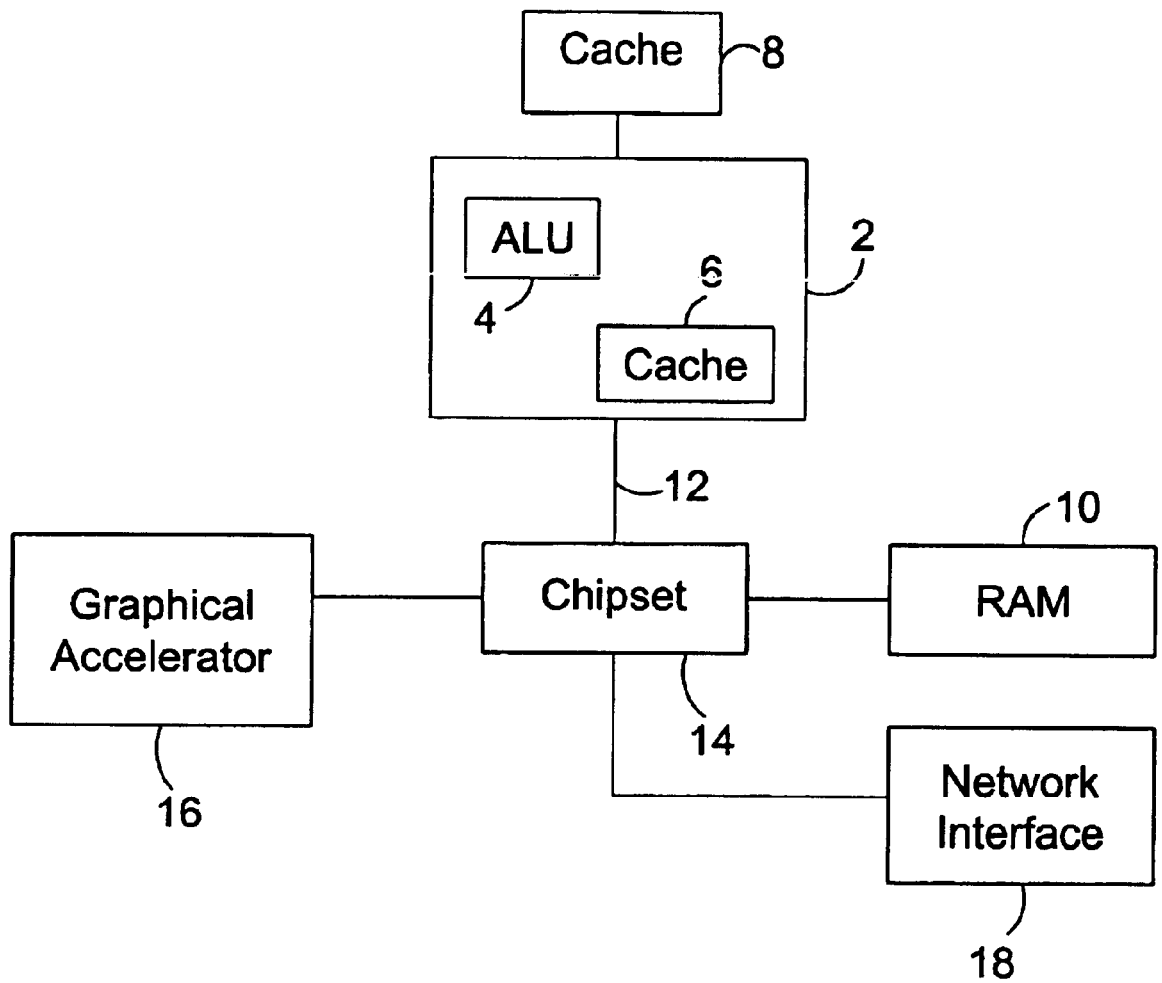
FIG. 1 illustrates an example of a computer system.

In the following detailed description of the embodiments, reference is made to the accompanying drawings that show, by way of illustration, specific embodiments in which the invention made be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

An embodiment of the present invention relates to threshold voltage compensation for use in a wide variety of applications including microprocessors. FIG. 1 shows an exemplary illustration of a computer system. The computer system may include a microprocessor 2, which can include many sub-blocks such as an arithmetic logic unit (ALU) 4 and an on-die cache 6. The microprocessor 2 may also communicate to other levels of cache, such as off-die cache 8. Higher memory hierarchy levels such as system memory 10 are accessed via host bus 12 and a chip set 14. In addition, other off-die functional units such as a graphics accelerator 16 and a network interface controller 18, to name just a few, may communicate with the microprocessor 2 via appropriate busses or ports.

Many devices today use logic circuits. These logic circuits operate at a logic level voltage, typically around 1.8 V. However, these logic circuits may receive or transfer signals to other devices or circuits. Some of these other devices or circuits may operate at a voltage level higher than the logic level voltage. In these situations, the signals transferred between the logic circuits and the other devices/circuits must be translated to the appropriate voltage level. One method of translating the voltage levels uses a level translating logic stack.

Figure 2:
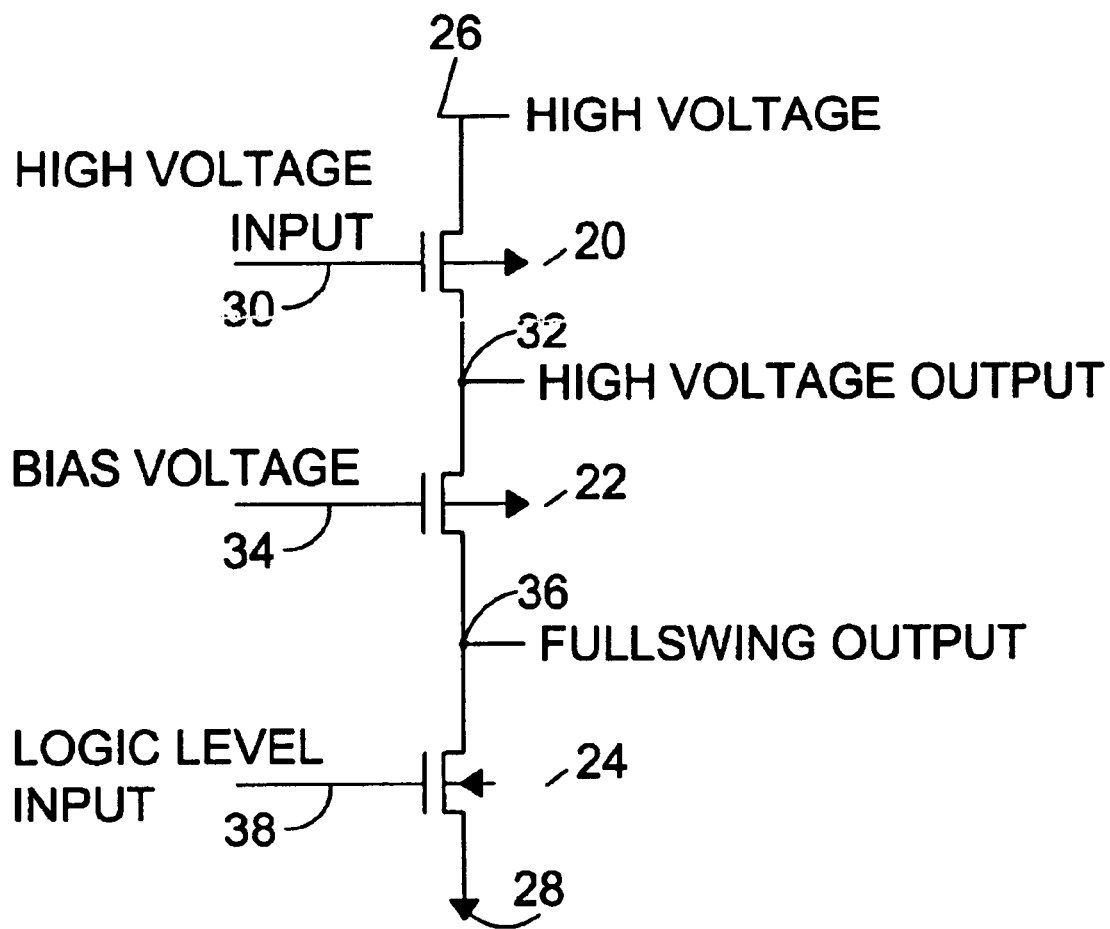
FIG. 2 illustrates an example of a level translating logic stack according to one embodiment of the invention.

FIG. 2 illustrates an example of a level translating logic stack according to one embodiment of the invention. As shown in FIG. 2, the level translating logic stack includes three transistors. A first PMOS transistor 20, a second PMOS transistor 22, and a third NMOS transistor 24 connected in series between a high voltage source 26 and ground 28. The first transistor 20 has a source connected to the high voltage source 26, a gate connected to a high voltage input 30, and a drain connected to a high voltage output 32. High voltage input 30 can come from a number of sources. For example, high voltage input 30 can originate from balanced switchers that rely on pulling current through opposing stacks of devices similar to the one shown in FIG. 2. The high voltage output 32 may be input into a number of different devices or stacks of devices. For example, high voltage output 32 can go to subsequent PMOS transistors in stacks similar to the one shown in FIG. 2. Moreover, while transistors 20 and 22 and transistor 24 have been shown to be PMOS and NMOS devices respectively, those skilled in the art can appreciate that other logic may be used to implement these features.

The second transistor 22 has a source connected to the high voltage output 32, a gate connected to a bias voltage 34, and a drain connected to a full swing output 36. The full swing output 36 may be supplied to a number of different devices or stacks of devices. For example, full swing output 36 can go to subsequent PMOS transistors in stacks similar to the one shown in FIG. 2. The full swing output 36 can be a swing from the high voltage rail down to a level above zero volts so that the difference between the high voltage rail and the "low" voltage is electrically safe for subsequent devices such as PMOS transistors. The third transistor 24 has a drain connected to the full swing output 36, a gate connected to a logic level input 38, and a source connected to the ground 28. The logic level input 38 can come from a number of sources. For example, logic level input 38 can originate from balanced switchers that rely on pulling current through opposing stacks of devices similar to the one shown in FIG. 2.

The level translating logic stack translates a high voltage input from a high voltage device or circuit to a logic level input through the use of high voltage output 32 and full swing output 36. The second transistor 22 operates as a protection device. The high voltage output node 32 provides a voltage swing that is between the high voltage source 26 and a voltage level defined as the bias voltage 34 plus the threshold voltage of the second transistor 22 (Vt). For example, if the high voltage source 26 is 3.3 V, the threshold voltage of the second transistor 22 is 0.5 V, and the bias voltage 34 is 0.8 V, the high voltage output node 32 will have a voltage swing from 3.3 V to 1.3 V. This is because the second transistor 22 is a PMOS transistor that will turn on if its gate voltage is lower than its source voltage. When the gate voltage is equal to or greater than the source voltage, the transistor will turn off. Thus, the second transistor 22 will pull the low voltage side of the voltage swing to a level no lower than the threshold voltage of the second transistor 22 plus the bias voltage 34 applied to the second transistor 22. Ideally, the high voltage output 32 should have a voltage swing of 2.0 V (3.3 V to 1.3 V). Preferably, a clamp (not shown) is provided on the node to enforce the low voltage of the voltage swing.

Transistors age with time and as they age, the threshold voltage of the transistor will change. Other factors can also affect the threshold voltage of transistors. The typical threshold voltage range is between 0.5 V (ideal threshold voltage) and a 0.7 V. As the threshold voltage increases, the output becomes weaker. This will result in a lower voltage swing at the high voltage output 32. To prevent the output from becoming weaker as the threshold voltage of the transistor changes, a compensation circuit can be used to adjust the bias voltage 34 applied to the second transistor 22.

Figure 3:
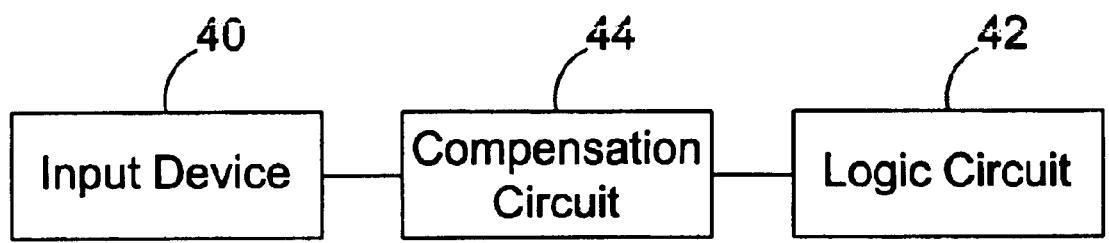
FIG. 3 illustrates a block diagram of a compensation circuit according to one embodiment of the invention.

FIG. 3 illustrates a block diagram of one embodiment of the invention, which includes a compensation circuit. As shown, an input device 40 is coupled to a logic circuit 42 through a compensation circuit 44. Input device 40 operates at a system voltage of 5.0 V. For example, input device 40 can be a legacy device such as a PCI or IDE device.

Logic circuit 42 operates at a system voltage of 3.3 V. For example, logic circuit 42 can be a portion of a microprocessor circuit for controlling a PCI or IDE device. The signals coming from and going to the input device 40 are preferably translated to an appropriate voltage level. In other words, the signals from input device 40 have to be translated from the 5.0 V level to the 3.3 V level before being input to the logic circuit 42. The compensation circuit 44 provides a translating circuit with voltage compensation to provide a strong output for the logic circuit 42 input, such as the high voltage output and full swing output shown in FIG. 2.

Figure 4:
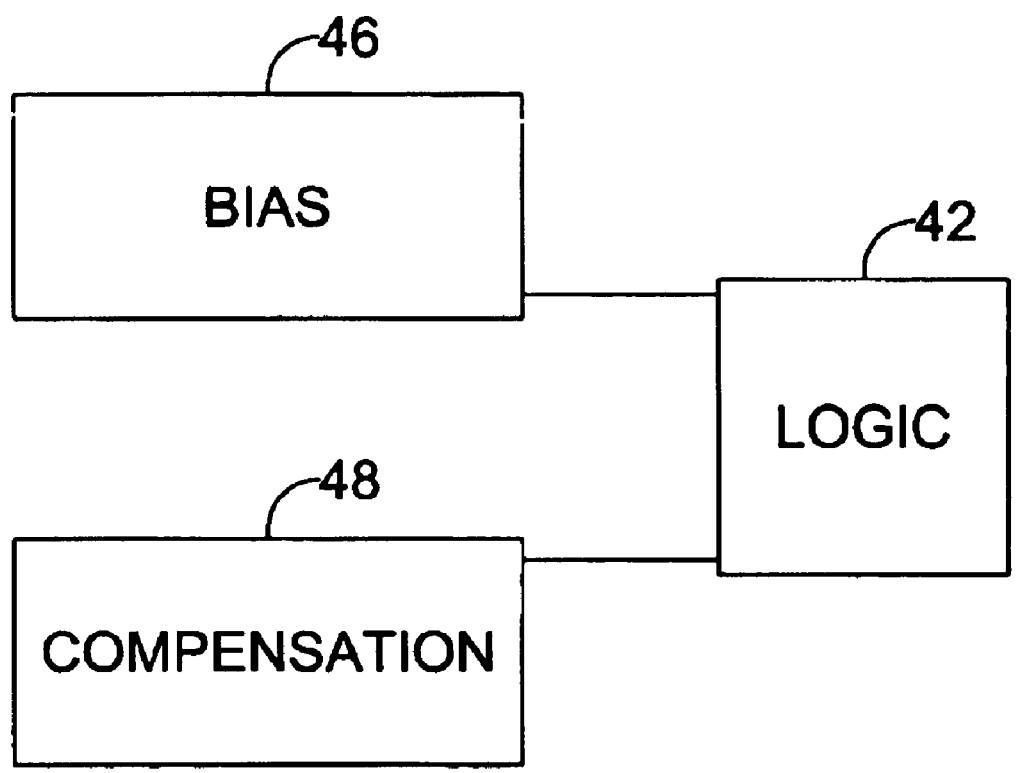
FIG. 4 illustrates a block diagram of a bias, compensation, and logic circuit according to one embodiment of the invention.

FIG. 4 illustrates a block diagram of another embodiment of the invention, which includes a compensation circuit and a bias circuit. As shown, the logic circuit 42 is coupled to a bias circuit 46 and a compensation circuit 48. The bias circuit 46 preferably provides a bias voltage input for transistors within the logic circuit 42. The compensation circuit 48 also provides a compensation voltage input for transistors within the logic circuit 42. For example, a transistor similar to the second transistor 22 within the logic circuit 42 can receive an input to its gate from both the bias circuit 46 and the compensation circuit 48. As the threshold voltage of this transistor varies, the combination of the bias voltage input and the compensation voltage input can be modified to maintain a strong output node coupled to this transistor.

Figure 5:
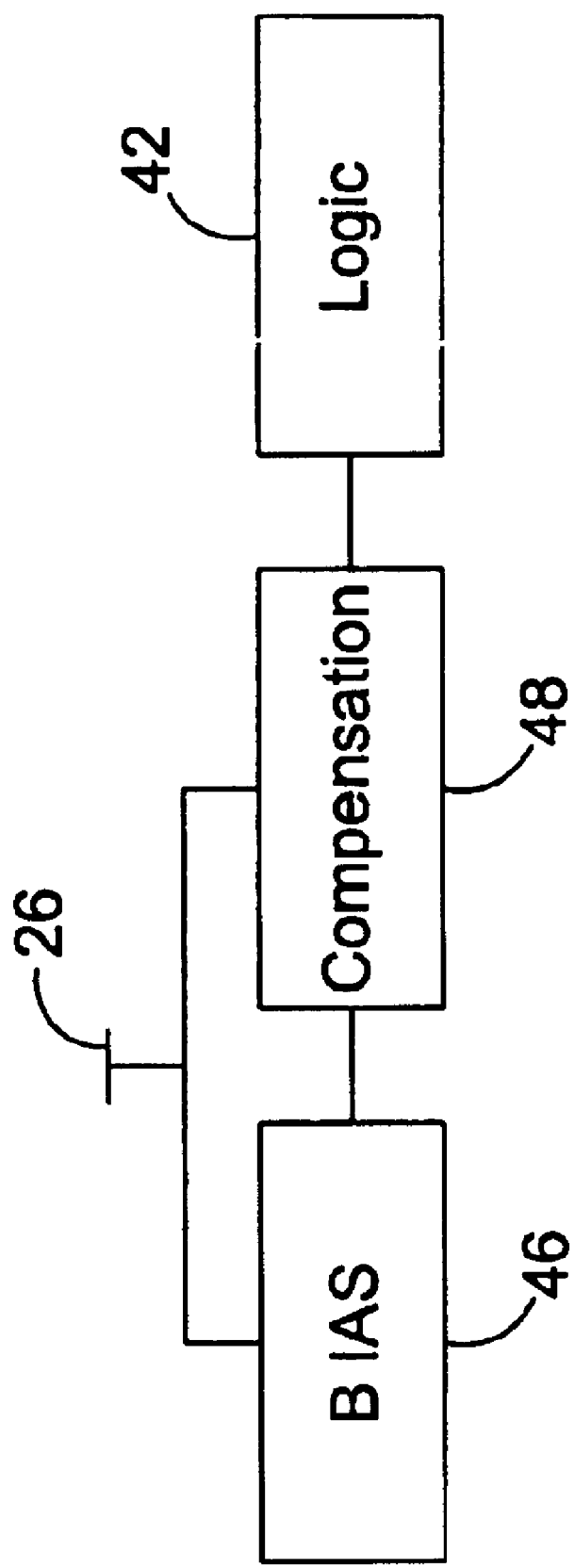
FIG. 5 illustrates a block diagram of a bias, compensation, and logic circuit according to one embodiment of the invention.

FIG. 5 illustrates a block diagram of another embodiment of the invention.

As shown, a high voltage source 26 is applied to both the bias circuit 46 and the compensation circuit 48. The bias circuit 46 can generate a bias voltage input for use within the logic circuit 42. The generated bias voltage input is filtered through the compensation circuit 48 before being input into the logic circuit 42. As changes occur in the threshold voltages of transistors within the logic circuit 42 that receive the bias voltage input, the compensation circuit 48 can add a compensation voltage to the bias voltage input to compensate for any variations in threshold voltages.

Figure 6:
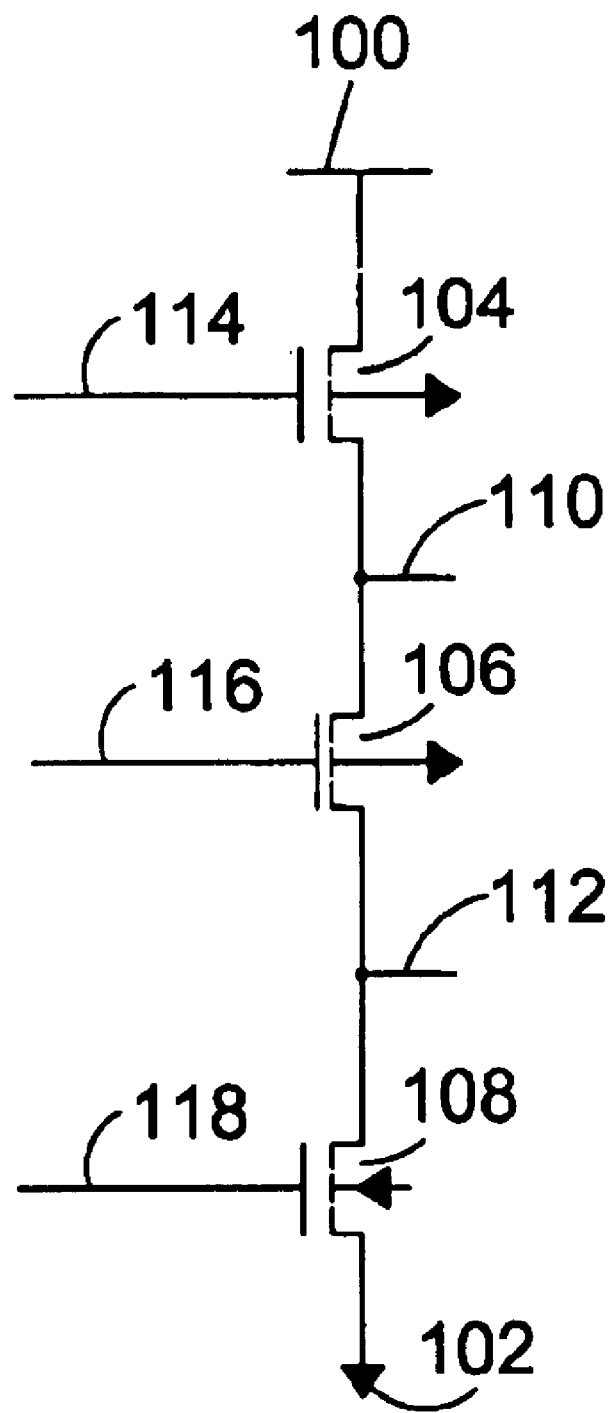
FIG. 6 illustrates an example of a logic stack according to one embodiment of the invention.

FIG. 6 illustrates an example of a level-translating logic stack according to one embodiment of the invention. As shown, the logic stack is connected between a voltage source 100 and a reference potential 102, which is preferably ground. The logic stack stack also includes a first output 110 and a second output 112. The first transistor 104 has a source connected to the voltage source 100, a gate connected to a first input 114, and a drain connected to the first output 110. The second transistor 106 has a source connected to the first output 110, a gate connected to a second input 116, and a drain connected to the second output 112. The third transistor 108 has a source connected to the ground 102, a gate connected to a third input 118, and a drain connected to the second output 112. The second transistor 106 acts as a protection and clamping device. The second input 116 plus the threshold voltage of the second transistor 106 provides the minimum voltage for the first output 110 and the maximum voltage for the second output 112 is provided by high voltage source 100. The maximum voltage for the first output 110 is provided by the voltage source 100 and the minimum voltage for the second output 112 is provided by the ground 102.

Figure 7:
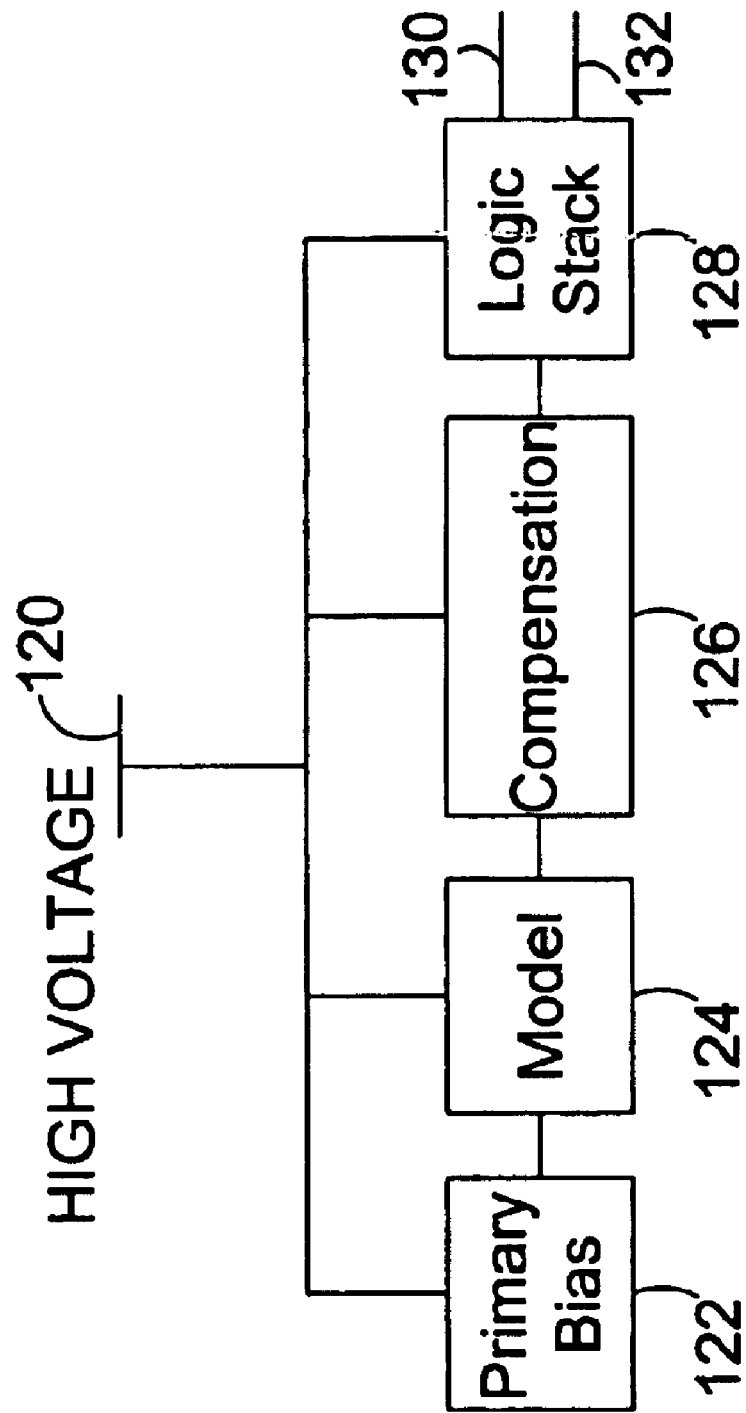
FIG. 7 illustrates a block diagram of a primary bias, model, compensation, and logic stack circuit according to one embodiment of the invention.

FIG. 7 illustrates a block diagram of another embodiment of the invention, which includes a compensation circuit As shown, a high voltage source 120 is applied to a primary bias circuit 122, a model signal circuit 124, a compensation circuit 126, and a level-translating logic stack 128. The primary bias circuit 122 generates a primary bias voltage signal that is applied to the logic stack 128 to bias the low voltage level of the high voltage output swing. The model signal circuit 124 generates a model signal that represents the low voltage level of the high voltage output swing of the logic stack 128. The compensation circuit 126 generates a compensation voltage signal. The compensation voltage signal is applied to the logic stack 128 to compensate for changes in the threshold voltages of transistor in the logic stack 128. For example, if a threshold voltage of a transistor in the logic stack 128 decreases by 0.2 volts, the compensation circuit 126 can generate a compensation signal of +0.2 volts and apply that signal to the logic stack 128 to compensation for the 0.2 volt decrease in the threshold voltage. The logic stack 128 can be similar to the circuit configuration shown in FIG. 6 with a high voltage output 130 and a full swing Output 132.

One exemplary implementation of the invention shown in FIG. 7 will now be described. This implementation uses a high voltage 120 of 3.3 V, a transistor threshold voltage of 0.5 V, a primary bias voltage signal of 0.8 V, and a target high voltage output swing of 3.3 V to 1.3 V. The high voltage output swing is between the voltage level of the high voltage 120 (3.3 V) and the voltage level defined by the primary bias voltage signal and the threshold voltage (0.8 V plus 0.5 V equals 1.3 V). The primary bias circuit 122 generates a primary bias voltage signal of 0.8 V. This voltage signal is transferred to the second transistor 106 as the second input 116. The model signal circuit 124 generates a model signal that represents the voltage level for the low voltage level of the high voltage output swing, in his case 1.3 V. The model signal circuit 124 monitors the low voltage shut off point of the second transistor 106 to generate a model signal that represents this point. There are many ways to accomplish this modeling. For example, the model signal circuit can model the threshold voltage level of the transistor 106 and add the bias voltage to this threshold voltage level since the bias voltage is a constant voltage. Alternatively, the threshold voltage can be modeled by the model signal without the bias voltage so that the model signal only models the threshold voltage and not the combination of the threshold voltage and the bias voltage. Also, a feedback loop can be used to model the low voltage level of the high voltage output swing and generate the model signal. The model signal is transferred to the compensation circuit 126.

As the threshold voltage of the second transistor 106 varies, the compensation circuit 126 generates a compensation voltage signal to restore the low voltage side of the high voltage output swing. The compensation voltage signal is transferred to the second input 116 of the second transistor 106. For example, if the bias voltage signal is 8.0 V and the threshold voltage of the second transistor 106 changes from 0.5 V to 0.7 V, the compensation circuit 126 detects the change in the model signal and the new low level of the high output swing (8.0 V plus 0.7 V equals 1.5 V). The compensation circuit 126 can be implemented in various ways to detect the change in the model signal and output the appropriate compensation signal. In order for the compensation circuit 126 to reduce the low voltage side of the high output swing to 1.3 V, the compensation circuit 126 preferably generates a −0.2 V compensation voltage signal. This will reduce the effective bias voltage at the second input 116 to 6.0 V, and restore the strength of the second transistor 106.

Figure 8:
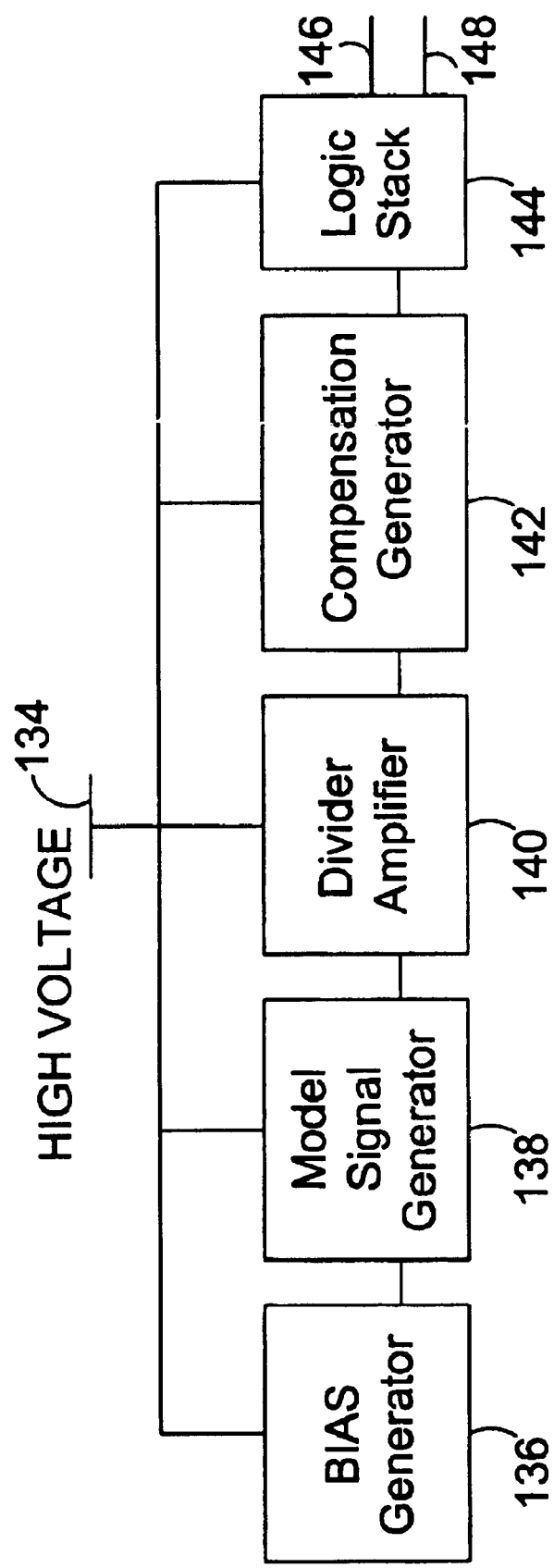
FIG. 8 illustrates a block diagram of a bias generator, model signal generator, divider-amplifier, compensation generator, and logic stack circuit.

FIG. 8 illustrates a block diagram of another embodiment of the invention, which includes a compensation circuit. As shown, this embodiment includes a bias generator 136 for generating a bias voltage, a model signal generator 138 for generating a model signal, a divider/amplifier 140, a compensation generator 142, and a logic stack 144 with a first output 146 and a second output 148. The model signal generator 138 generates a model signal that represents the low voltage level of the first output 146 swing of the logic stack 144. The compensation generator 142 generates a compensation voltage signal in response to the model signal and the divider/amplifier 140. The model signal and the bias voltage are sent through the divider/amplifier 140 and the compensation generator 142. As they are transferred through these components, the bias voltage is automatically adjusted to maintain the low voltage output swing of the first output 146 at the desired level before being input to the logic stack 144.

Figure 9:
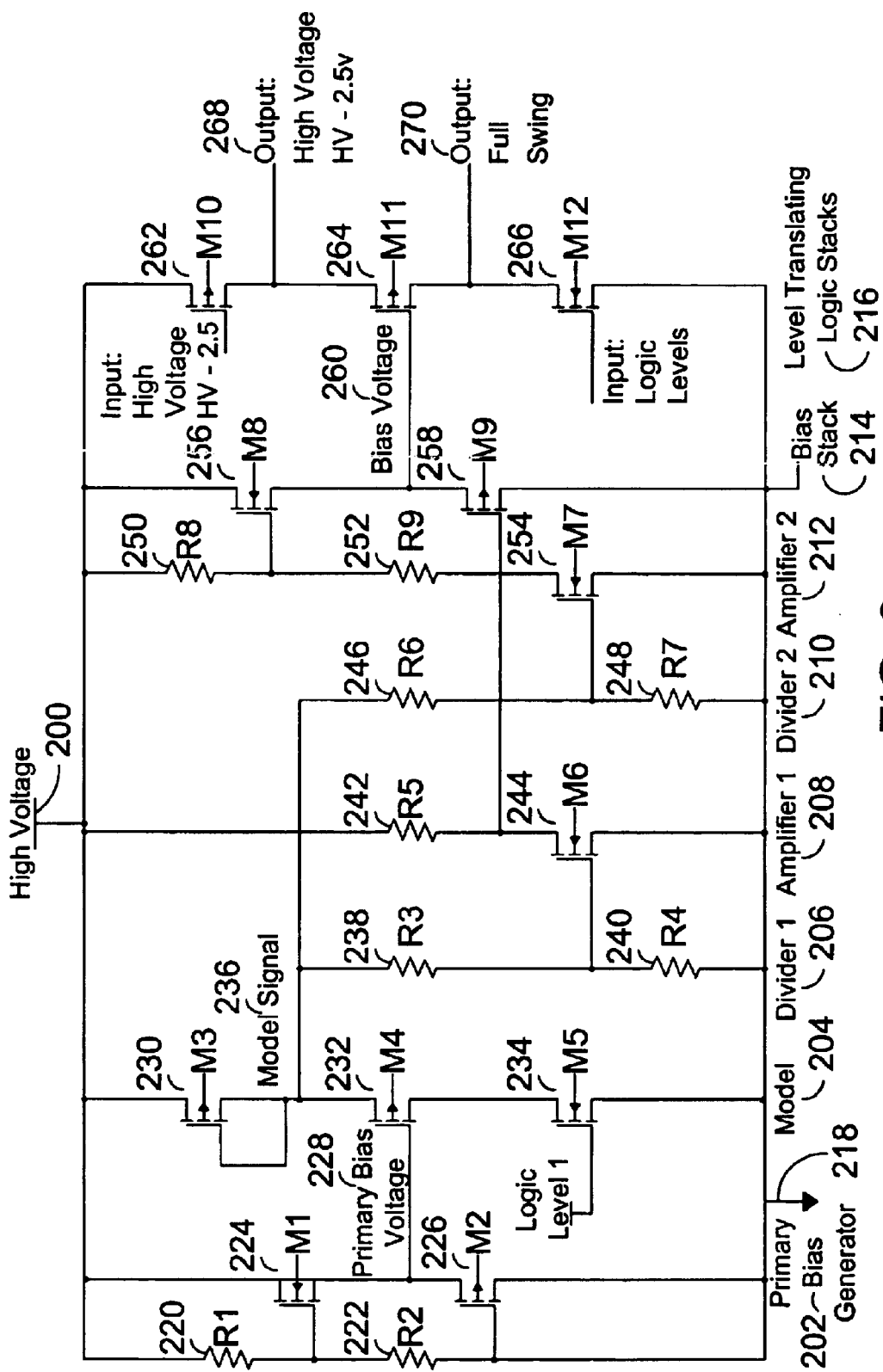
FIG. 9 illustrates a circuit diagram of a bias and compensation circuit according to one embodiment of the invention.

FIG. 9 is a circuit diagram showing another embodiment of the invention. This embodiment includes a high voltage source 200, a primary bias generator 202, a model signal generator 204, a first divider 206, a first amplifier 208, a second divider 210, a second amplifier 212, a bias stack 214, and a level translating logic stack 216. All of the components 202 through 216 are connected between the high voltage source 200 and a ground 218.

The primary bias generator 202 includes a first resistor 220, a second resistor 222, a first transistor 224, and a second transistor 226. The first resistor 220 and the second resistor 222 are connected in series between the high voltage source 200 and the ground 218. The first transistor 224 and the second transistor 226 are also connected in series between the high voltage source 200 and the ground 218. The primary bias generator 202 generates a primary bias voltage 228 at a node between the first and second transistor 224, 226. The model stage 204 includes a third transistor 230, a fourth transistor 232, and a fifth transistor 234. The transistors 230–234 are connected in series between the high voltage source 200 and the ground 218. The third transistor 230 has a feedback loop between its drain and gate. The model stage 204 generates a model signal 236 at a node between the third transistor 230 and the fourth transistor 232. The fourth transistor 232 has its gate coupled to the primary bias voltage 228. The fifth transistor 234 has its gate coupled to a first logic level.

The first divider stage 206 includes a third resistor 238 and a fourth resistor 240 connected in series between the model signal node and ground 218. The first amplifier stage 208 includes a fifth resistor 242 and a sixth transistor 244 connected in series between the high voltage source 200 and the ground 218. The transistor 244 has its gate coupled to a node between resistor 238 and resistor 240. The second divider stage 210 includes a sixth resistor 246 and a seventh resistor 248 connected in series between the model signal node and ground 218. The second amplifier stage 212 includes on eighth resistor 250, a ninth resistor 252, and a seventh transistor 254 connected in series between the high voltage source 200 and ground 218. The gate of the seventh transistor 254 is coupled to a node between the sixth resistor 246 and the seventh resistor 248. The bias stack stage 214 includes an eighth transistor 256 ninth transistor 254 connected in series between the high voltage source 200 and ground 218. The eighth transistor 256 has a gate coupled to a node between the eighth resistor 250 and the ninth resistor 252. The ninth transistor 258 has a gate coupled to a node between the fifth resistor 242 and the sixth transistor 244. The bias stack stage 214 generates a bias voltage 260 at a node between the eighth transistor 256 and the ninth transistor 258.

The level translating logic stack 216 includes a tenth transistor 262, an eleventh transistor 264, and a twelfth transistor 266 connected in series between the high voltage source 200 and ground 218. The tenth transistor 262 has a gate coupled to a high voltage input. The eleventh transistor 264 has a gate coupled to the bias voltage 260 node. The twelfth transistor 266 as a gate coupled to a logic level input. Stack 216 also has a high voltage output node 268 between the tenth transistor 262 and the eleventh transistor 264 and a full swing output node 270 between the eleventh transistor 264 and the twelfth transistor 266.

The functional aspects of FIG. 9 will now be described. The high voltage source 200 is a constant voltage source that provides the voltage for the circuit. In the example above, the high voltage source 200 is a constant voltage source that provides 3.3 V DC. The primary bias generator 202 generates a bias voltage signal. As shown in FIG. 9, the bias voltage signal is generated by having a voltage divider (resistors 220 and 222) provide a voltage signal to bias the gates of a pair of series connected transistors 224 and 226. The biased transistors in turn control the output voltage of a node between the transistors 224 and 226. This node is controlled to have a constant 8.0 V voltage for use in the circuit. The voltage at the node is based on the size of the resistors and transistors in the primary bias generator 202.

The model signal generator 204 generates a model signal by configuring a PMOS transistor 230 in a gate drain feedback mode (configured to act as a diode connected PMOS) and connecting at its source to the high voltage 200. Another PMOS transistor 232 has its source connected to the drain of the transistor 230 and its gate connected to the output of the bias voltage generator. A third transistor 234 has its drain connected to the drain of the transistor 232, its source connected to the ground 218, and its gate connected to a logical input. These three transistors mimic or model the transistors (and outputs) in the target circuit's level-translating logic stack. A node between the transistors 230 and 232 is held at a voltage level equal to the bias voltage applied to the transistor 232 plus the threshold voltage of transistor 234. Any change in the threshold voltage of transistor 232 is reflected in the model signal voltage. Thus, the model signal voltage models the threshold voltage (plus bias voltage applied) of transistor 264.

The first divider 206 divides the voltage of the model signal and applies it to the gate of transistor 244, which is part of the inverting amplifier 208. The output of amplifier 208 controls the voltage applied to the gate of transistor 258. The second divider 210 divides the voltage of the model signal and applies it to the gate of transistor 254, which is part of the inverting amplifier 212. The output of amplifier 212 controls the voltage applied to the gate of transistor 256. The bias stack 214 is composed of the two transistors 256 and 258. These transistors are biased with gate voltages 2 V apart. The node 260 between these transistors has the bias voltage that is applied to the gate of transistor 264, and all transistors in that position in the target circuit's level translating stacks. This node reflects the changes in the model signal such that the bias voltage is lowered in response to a greater threshold voltage at transistor 232, and is raised for a lower threshold voltage at transistor 232.

The level-translating logic stack 216 has two outputs, output 268 and 270. Output 268 is controlled to have a voltage swing between the high voltage 200 and a low voltage defined by the bias voltage applied to transistor 264 plus the threshold voltage of transistor 264. The output 270 is controlled to have a voltage swing between the high voltage 200 and the ground 218. When a logic low input is applied to transistors 262 and 266, the outputs 268 and 270 will output the high voltage level of high voltage 200. When a logic high input is applied to transistors 262 and 266, the output 268 will have a low voltage output (~-1.3V in the example above) and the output 270 will have a voltage equal to the ground 218.

Since the low level of output 268 is dependent on the threshold voltage of transistor 264, the size of the voltage swing is dependent on the threshold voltage. When the threshold voltage is lower, there is a higher swing, and the next stage of level translating logic (whose P device is in the position of transistor 262) receives a better Vgs, and its own transistors are stronger, due to their threshold voltages being lower as well. When the threshold voltage is higher, there is a reduced swing, as well as the recipient's weaker driver. The response of node 260, to threshold voltage moves opposite to this trend, reduces the variation in drive strength in all level translating stacks.

One embodiment of the present invention is a threshold voltage compensation circuit for a transistor logic stack of a logic circuit interfaced with a input device operating at higher voltage level then the logic circuit. For example, a computer system as illustrated in FIG. 1 may include logic circuits operating at a typical system voltage of 3.3 V. This computer system may interface with additional input devices, such as IDE or PCI devices, that operate at a system voltage higher than the 3.3 V system voltage of the logic circuits. FIG. 2 illustrates an example of this situation. As shown in FIG. 2, an input device 20 is connected to a logic circuit 22 through a compensation circuit 24.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art In the claims, means-plus-function clauses are intended to cover the structures described herein as performing the recited function and not only structural equivalents but also equivalent structures.

What is claimed is:

1. A compensation circuit, comprising:
a signal generator to generate a compensation signal to be applied to a target transistor based on a comparison of a first voltage level and a target voltage level, the compensation signal to compensate for specific threshold variations of the target transistor.

2. The compensation circuit of claim 1, wherein the compensation signal is coupled to the target transistor to bias a cut off voltage of the target transistor.

3. The compensation circuit of claim 1, further comprising a bias signal generator to generate a bias signal at a second voltage level, the bias signal being coupled to a target transistor to bias a cut off voltage of the target transistor.

4. The compensation circuit of claim 3, further comprising a model signal generator to generate a model signal at the first voltage level based on the bias signal and a threshold voltage of the target transistor.

5. A bias voltage compensation circuit, comprising:
a transistor adapted to output an output voltage, the transistor having a threshold voltage;
a bias voltage generator to generate a bias voltage signal at a bias voltage, the bias voltage signal being coupled to the transistor;
a compensator to generate a compensation voltage signal at a compensation voltage, the compensation voltage signal being coupled to the transistor; and
a model signal generator to generate a model signal at an actual voltage, the model signal being coupled to the compensator;
wherein the compensation voltage is based on a difference between an ideal voltage and the actual voltage of the model signal.

6. The bias voltage compensation circuit of claim 5, further comprising:
a first output transistor coupled between a first reference voltage and the transistor; and
a second output transistor coupled between a second reference voltage and the transistor.

7. The bias voltage compensation circuit of claim 6, wherein the first output transistor and the transistor form a first output node and the transistor and the second output transistor form a second output node.

8. The bias voltage compensation circuit of claim 6, wherein the first output transistor is a PMOS transistor, the second output transistor is a NMOS transistor, and the transistor is a PMOS transistor.

9. The bias voltage compensation circuit of claim 5, wherein the bias voltage generator comprises:
a first bias resistor and a second bias resistor connected in series between a first reference voltage and a second reference voltage; and a first bias transistor and a second bias transistor connected in series between the first reference voltage and the second reference voltage;

wherein a gate of the first bias transistor is connected between the first bias resistor and the second bias resistor, a gate of the second bias transistor is connected between the second bias resistor and the second reference voltage, and the bias voltage signal is generated between the first bias transistor and the second bias transistor.

10. The bias voltage compensation circuit of claim 5, wherein the model signal generator comprises:

a first model transistor having a gate connected to a drain, and a source connected to a first reference voltage;

a second model transistor having a source connected to the drain of the first model transistor, a gate coupled to the bias voltage generator, and a drain; and a third model transistor having a drain connected to the drain of the second model transistor, a gate coupled to a logic input, and a source connected to a second reference voltage;

wherein the model signal is generated between the first model transistor and the second model transistor.

11. The bias voltage compensation circuit of claim 5, wherein the compensator comprises:

a first voltage divider coupled between the model signal generator and a second reference voltage;

a first voltage amplifier connected between a first reference voltage and the second reference voltage, the first voltage amplifier being coupled to the first voltage divider;

a second voltage divider coupled between the model signal generator and the second reference voltage;

a second voltage amplifier connected between the first reference voltage and the second reference voltage, the second voltage amplifier being coupled to the second voltage divider; and a bias stack connected between the first reference voltage and the second reference voltage, the bias stack having a first stack transistor coupled to the first voltage amplifier and a second stack transistor coupled to the second voltage amplifier.

12. The bias voltage compensation circuit of claim 5, wherein the ideal voltage is a minimum voltage level of the output.

13. The bias voltage compensation circuit of claim 5, wherein the bias voltage is approximately 0.8 volts.

14. The bias voltage compensation circuit of claim 5, wherein the ideal voltage is approximately equal to the bias voltage plus the threshold voltage.

15. The bias voltage compensation circuit of claim 5, wherein the ideal voltage is approximately 1.3 volts.

16. A system, comprising:

an input component to generate an input signal at a first voltage level;

a logic stack operating at a second voltage level, the logic stack receiving the input signal at the first voltage level and translating the input signal to the second voltage level; and a compensation component to generate a bias signal at a variable voltage level, the bias signal being applied to a bias transistor within the logic stack, and the variable voltage level being adjusted in response to a threshold voltage of the bias transistor.

17. The system of claim 16, wherein the logic stack comprises:

a first transistor coupled between a first reference voltage and the bias transistor, the first transistor and the bias transistor forming a first output node to output a first output signal; and a second transistor coupled between the bias transistor and a second reference voltage, the second transistor and the bias transistor forming a second output node to output a second output signal;

wherein the first reference voltage is higher than the second reference voltage, the first output voltage has a range between the first reference voltage and a bias voltage level, and the second output voltage has a range between the first reference voltage and the second reference voltage.

18. The system of claim 17, wherein the bias voltage level approximately equals the bias signal plus a threshold voltage of the bias transistor.

19. The system of claim 16, wherein the bias signal is coupled to a gate of the bias transistor.

20. A method of compensating a transistor, comprising:

generating a compensation voltage to be applied to the transistor based on a comparison of an actual voltage level and a target voltage level, the compensation voltage to compensate for specific threshold variations of the transistor; and applying the compensation voltage to the transistor.

21. The method of claim 20, further comprising:

generating a bias voltage; and applying the bias voltage to the transistor.

22. The method of claim 21, further comprising:

generating a model voltage level approximately equal to a threshold voltage of the transistor; and generating the compensation voltage based on a difference between the model voltage level to the target voltage level.

23. A system comprising:

a microprocessor; and a component in communication with the microprocessor;

wherein the microprocessor comprises:

a transistor adapted to output an output voltage, the transistor having a threshold voltage;

a bias voltage generator to generate a bias voltage signal at a bias voltage, the bias voltage signal being coupled to the transistor;

a compensator to generate a compensation voltage signal at a compensation voltage, the compensation voltage signal being coupled to the transistor; and a model signal generator to generate a model signal at an actual voltage, the model signal being coupled to the compensator, wherein the compensation voltage is based on a difference between an ideal voltage and the actual voltage of the model signal.

24. The system of claim 23, wherein the bias voltage generator comprises:

a first bias resistor and a second bias resistor connected in series between a first reference voltage and a second reference voltage; and a first bias transistor and a second bias transistor connected in series between the first reference voltage and the second reference voltage;

wherein a gate of the first bias transistor is connected between the first bias resistor and the second bias resistor, a gate of the second bias transistor is connected between the second bias resistor and the second reference voltage, and the bias voltage signal is generated between the first bias transistor and the second bias transistor.

25. The system of claim 23, wherein the model signal generator comprises:

a first model transistor having a gate connected to a drain, and a source connected to a first reference voltage;

a second model transistor having a source connected to the drain of the first model transistor, a gate coupled to the bias voltage generator, and a drain; and a third model transistor having a drain connected to the drain of the second model transistor, a gate coupled to a logic input, and a source connected to a second reference voltage;

wherein the model signal is generated between the first model transistor and the second model transistor.

26. The system of claim 23, wherein the compensator comprises:

a first voltage divider coupled between the model signal generator and a second reference voltage;

a first voltage amplifier connected between a first reference voltage and the second reference voltage, the first voltage amplifier being coupled to the first voltage divider;

a second voltage divider coupled between the model signal generator and the second reference voltage;

a second voltage amplifier connected between the first reference voltage and the second reference voltage, the second voltage amplifier being coupled to the second voltage divider; and a bias stack connected between the first reference voltage and the second reference voltage, the bias stack having a first stack transistor coupled to the first voltage amplifier and a second stack transistor coupled to the second voltage amplifier.

* * * * *